United States Patent
Liu et al.

(10) Patent No.: US 8,513,981 B2
(45) Date of Patent: Aug. 20, 2013

(54) SQUELCH DETECTION METHOD AND CIRCUIT USING RECTIFYING CIRCUIT FOR DETECTING OUT-OF-BAND SIGNAL

(75) Inventors: Xin Liu, El Dorado Hills, CA (US); Arvind Bomdica, Fremont, CA (US)

(73) Assignee: Advanced Micro Devices, Sunnyvale, CA (US)

( * ) Notice: Subject to any disclaimer, the term of this patent is extended or adjusted under 35 U.S.C. 154(b) by 66 days.

(21) Appl. No.: 13/316,737

(22) Filed: Dec. 12, 2011

(65) Prior Publication Data

US 2013/0147556 A1  Jun. 13, 2013

(51) Int. Cl.
*H03K 5/22*  (2006.01)

(52) U.S. Cl.
USPC .................................. 327/74; 327/65; 327/89

(58) Field of Classification Search
USPC ............................... 327/65, 74, 89
See application file for complete search history.

(56) References Cited

U.S. PATENT DOCUMENTS

| | | | |
|---|---|---|---|
| 6,246,268 B1 * | 6/2001 | Cheng | 327/65 |
| 6,486,710 B1 * | 11/2002 | Simoni | 327/63 |
| 7,199,620 B2 * | 4/2007 | Ishizuka et al. | 327/65 |
| 7,894,055 B2 | 2/2011 | Mertz et al. | |
| 7,999,595 B2 | 8/2011 | Namkoong et al. | |
| 8,138,803 B2 | 3/2012 | Ng et al. | |

* cited by examiner

*Primary Examiner* — William Hernandez
(74) *Attorney, Agent, or Firm* — Meyertons Hood Kivlin Kowert & Goetzel; Erik A. Heter

(57) ABSTRACT

A circuit for detecting out-of-band signals is disclosed. In one embodiment, the circuit includes a first differential circuit configured to level shift and positively rectify a differential input signal to produce a first output component of a differential output signal. The first differential circuit is further configured to generate and provide a common mode voltage of the differential input signal as a second component of the differential output signal. The circuit further includes a second differential circuit configured to level shift and output first and second fixed voltages based on an input reference voltage and a ground voltage. The circuit is configured to provide the differential output signal and the first and second fixed voltages to an indicator circuit configured to assert an indication responsive to detecting that a differential voltage of the differential output signal is greater than a differential voltage of the first and second fixed voltages.

20 Claims, 9 Drawing Sheets

SQUELCH DETECTION METHOD AND CIRCUIT USING RECTIFYING CIRCUIT FOR DETECTING OUT-OF-BAND SIGNAL

BACKGROUND

1. Field of the Invention

This invention relates to electronic circuits, and more particularly, to level shifting and rectifying circuits.

2. Description of the Related Art

Increasing processing speeds of devices such as graphics processors, hard disks, network cards, and other high-speed I/O devices have created a need for an increased bandwidth for communicating between devices. One way to increase bandwidth between the bridge circuit and the I/O device is to use a differential communication link such as PCI (Peripheral Component Interface) Express, HyperTransport, SATA (Serial Advanced Technology Attach), USB (Universal Serial Bus), and other suitable differential communication links. Such interfaces may utilize a flexible, hybrid serial-parallel interface format that uses multiple differential communication links often referred to as lanes. Each link may include transmit lanes to transmit information and receive lanes to receive information.

During certain modes of operation such as during a non-transmission mode, a low power mode, and/or other suitable modes of operation, the transmit lanes may be clamped (e.g., coupled) to the same voltage (e.g., common mode voltage). As such, a receiver associated with the receive lanes may detect this mode of operation by sensing a differential voltage swing of the differential communication link. For example, the receiver may be able to detect that the transmit lines are clamped when the voltage swing is less than a low threshold and that the transmit lines are not clamped when the differential voltage swing is greater than a high threshold. Other techniques may be used to determine a mode of operation as well.

SUMMARY OF THE DISCLOSURE

A circuit for detecting out-of-band signals is disclosed. In one embodiment, the circuit includes a first differential circuit configured to level shift and positively rectify a differential input signal to produce a first output component of a differential output signal. The first differential circuit is further configured to generate and provide a common mode voltage of the differential input signal as a second component of the differential output signal. The circuit further includes a second differential circuit configured to level shift and output first and second fixed voltages based on an input reference voltage and a ground voltage. The circuit is configured to provide the differential output signal and the first and second fixed voltages to an indicator circuit configured to assert an indication responsive to detecting that a differential voltage of the differential output signal is greater than a differential voltage of the first and second fixed voltages.

In one embodiment, a method for operating a circuit includes generating a first output component of a differential output signal by a first differential circuit level shifting and positively rectifying a differential input signal. The method further includes generating a second output component of the differential output signal by the first differential circuit generating a common mode voltage of the differential input signal, and generating first and second fixed voltages in a second differential circuit based on an input reference voltage and a ground voltage. A signal is asserted responsive to a comparator determining that a voltage difference between the first and second components of the differential output signal is greater than a difference between the first and second fixed voltages.

BRIEF DESCRIPTION OF THE DRAWINGS

Other aspects of the disclosure will become apparent upon reading the following detailed description and upon reference to the accompanying drawings, which are briefly described below.

Figure 1:
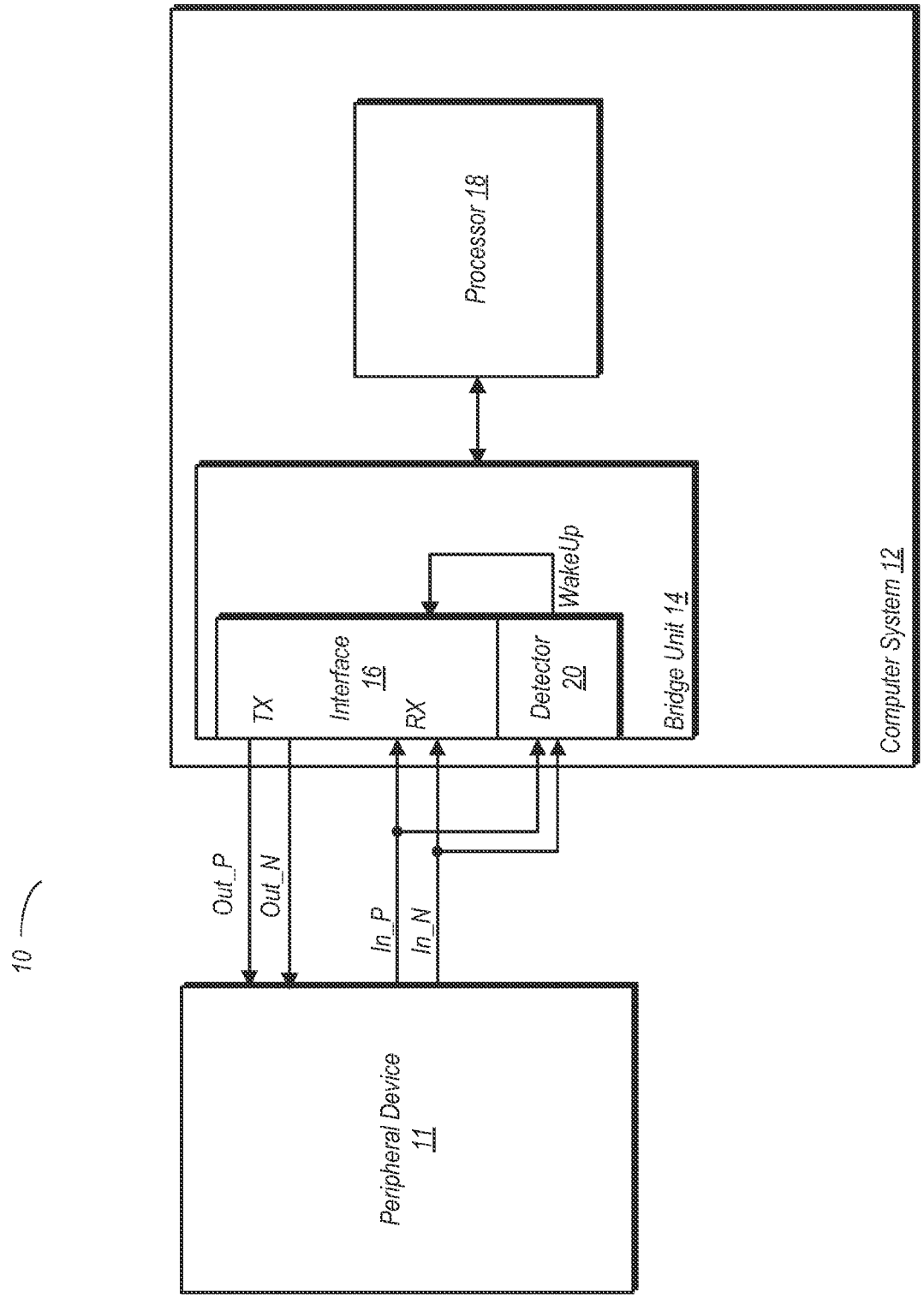
FIG. 1 is a block diagram of one embodiment of a system.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION

Overview:

The present disclosure is directed to a circuit for detecting an out-of-band signal. The out-of-band signal may be transmitted by another circuit in order to cause a corresponding circuit to exit a low power mode (e.g., a sleep state). In an embodiment discussed below, the out-of-band signal may be a differential signal transmitted on a same differential signal path as data is transmitted between the transmitting and receiving circuits. A detector may include a detection circuit that is configured to level shift and rectify the received out-of-band signal to produce a differential output signal. The differential output signal may be provided to a comparator unit configured to compare a differential voltage of the differential output signal to a differential reference voltage. If the differential voltage of the differential output signal is greater than the differential reference voltage, then the detector circuit may assert a signal that causes a corresponding circuit unit to exit the low power mode. Exemplary embodiments of a system and circuitry implementing a detector will be discussed below. However, it is noted that these embodiments are not intended to be limiting, and thus the circuitry to be described herein may be implemented in a wide variety of applications.

In one embodiment, out-of-band signaling is a pattern of burst data and idle time. An out-of-band burst is a short pulse of high-speed data starting from and ending with idle time. During the idle time, the out-of-band data is static, i.e. both of the differential interconnect wires at the receiver are clamped (e.g., coupled) to the same voltage (e.g., a common mode voltage).

The detector may operate as follows. When the differential voltage swing is greater than a high threshold, the detector output may generate a logic 1. This indicates to the receiver control logic that the received data is valid out-of-band burst data, and that the other parts of the receiver should wake up from a low power state. When the input differential swing is less than a low threshold, the detector output may generate a logic 0. This indicates to the receiver control logic that the received data is invalid out-of-band burst data, and that the other portions of the receiver may remain in a low power state.

Exemplary System:

Turning now to FIG. 1, a block diagram of one embodiment of a system is shown. In the embodiment shown, system 10 includes a peripheral device 11 coupled to a computer system 12. More particularly, peripheral device 11 is coupled to an interface 16 of a bridge unit 14. Bridge unit 14 in turn is coupled to a processor 18. Accordingly, communications between peripheral device 11 and processor 18 may be routed through interface 16 of bridge unit 14.

Peripheral device 11 is coupled to interface 16 by an input differential signal path and an output differential signal path in the illustrated embodiment. The input path is coupled to a receiver (RX) of interface 16. The input differential signal path includes two signal lines, In_P and In_N. The output differential signal path includes the signal lines Out_P and Out_N, which are coupled to a transmitter (TX) of interface 16. In this embodiment, the transmission of data on the differential signal paths may be uni-directional. However, embodiments in which a differential signal path is a bi-directional signal path for transmitting data from and receiving data in peripheral device 11 to interface 16 are also possible and contemplated.

Peripheral device 11 may be one of a number of different types of peripheral devices, including (but not limited to) hard disk drives, printers, multimedia devices, and so on. In one embodiment, interface 16 may be a serial advanced technology attachment (SATA) interface, while peripheral 11 is configured to attaching to a SATA interface. However, other types of interfaces utilizing differential signaling (e.g., USB, Firewire, etc.) are also possible and contemplated.

Various devices in computer system 12 (and more generally, in system 10) may be configured to enter a low power state when idle. For example, if no data has been transmitted between bridge unit 14 and peripheral device 11 for a specified amount of time, interface 16 may enter a low power state in order to save power. The circuitry of interface 16 (or portions thereof) may be clock-gated and/or power-gated when in a low power state. Furthermore, multiple low power states are possible and contemplated (e.g., one state that is clock-gated, another state that is both clock and power-gated).

In order to initiate communications between peripheral device 11 and bridge unit 14, a signal may be sent to interface circuit 16 in order to cause it to exit the low power state. The exiting of the low power state may be initiated by peripheral device 11. Bridge unit 14 in embodiment shown includes a detector 20 that is coupled to receive differential signals transmitted by peripheral device 11. Detector 20 is configured to detect an out-of-band signal transmitted by peripheral device 11 that may be used to cause interface circuit 16 to exit the low power state and begin communications. In the various embodiments to be discussed herein, the out-of-band signal may be one in which the differential voltage is greater than that used for normal data communications between peripheral device 11 and interface circuit 16. Responsive to receiving and detecting an out-of-band signal transmitted by peripheral device 11, detector 20 may assert a signal ('WakeUp'). Responsive to receiving the signal from detector 20, interface circuit 16 may exit the low power state and begin communications with peripheral device 11.

It is noted that while the particular application of detector 20 in the illustrated embodiment is directed to communications between a unit of an integrated circuit (IC) and a device external to the (IC), the disclosure is not intended to be limiting in this manner. More particularly, embodiments of detector 20 may be implemented to facilitate an exit from a low power state and initiation of communications for two separate circuits implemented on a signal IC die.

Figure 2:
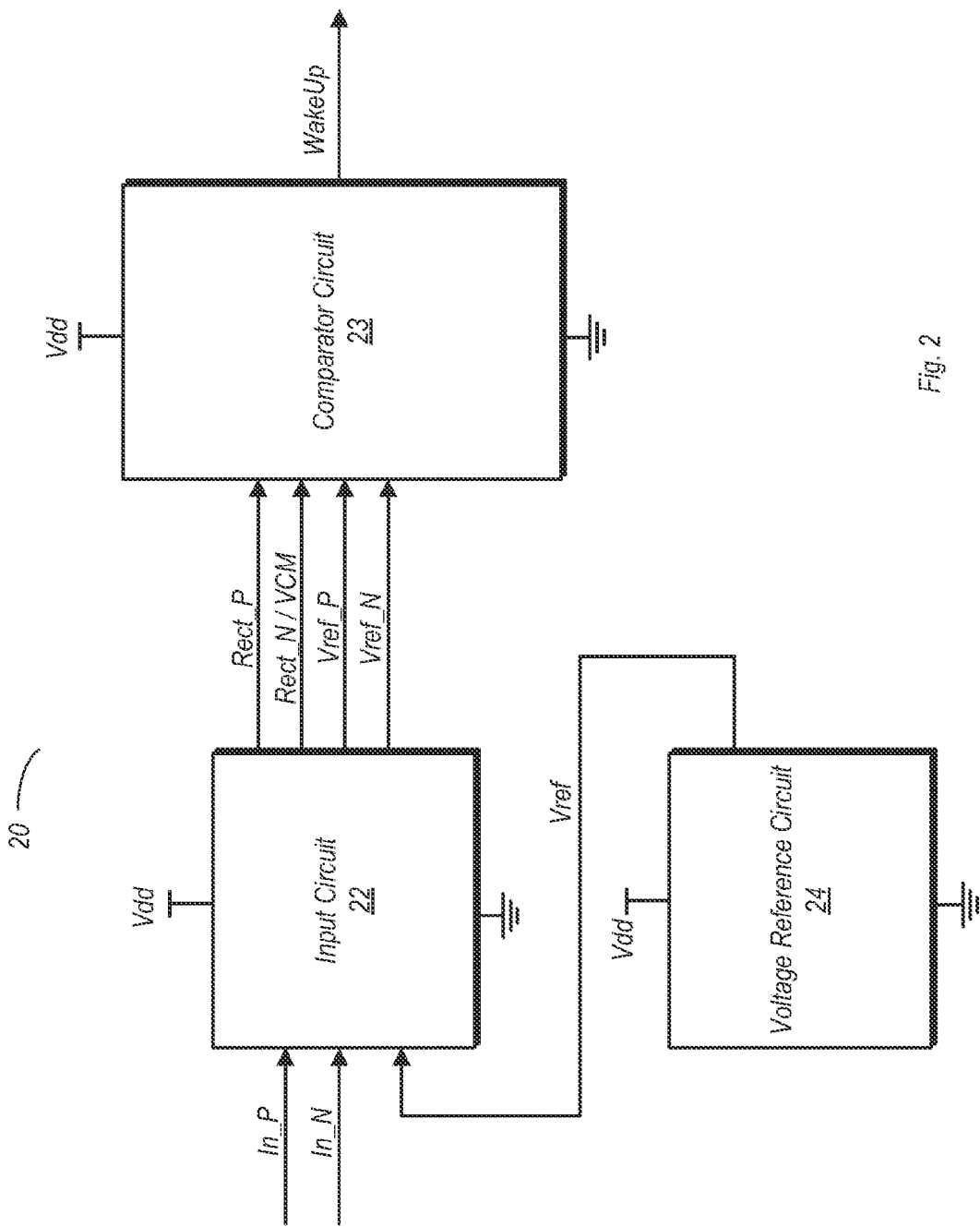
FIG. 2 is a block diagram of one embodiment of a detector.

FIG. 2 illustrates one embodiment of a detector 20. In the embodiment shown, detector 20 includes an input circuit 22, a voltage reference circuit 24, and a comparator circuit 23. Input circuit 22 is coupled to receive first and second components of a differential input signal, In_P and In_N, respectively. Voltage reference circuit 24 in the embodiment shown is configured to generate a substantially fixed reference voltage, 'Vref', which is received as an additional input by input circuit 22.

Input circuit 22 in the embodiment shown is configured to generate two differential output signals having two components each. In one embodiment, a first of these differential output signals includes first and second components Rect_P and Rect_N, respectively. These components may be generated level shifting and rectification circuits within input circuit 22. The level shifting and rectifications circuits and operation thereof will be discussed in further detail below with reference to FIG. 3. I another embodiment, the first differential output signal includes first and second components Rect_P and VCM, respectively. These components, Rect_P and VCM, may be generated by circuitry that will be discussed in further detail below with reference to FIG. 6. The second differential signal provided by input circuit 22 is a differential reference voltage including components 'Vref_P' and 'Vref_N'. As will also be discussed below, input circuit 22 may generate the differential reference voltage based in the input reference voltage 'Vref' and a ground voltage.

Comparator circuit 23 in the embodiment shown is coupled to receive the differential output signal and the differential reference voltage from input circuit 22. In the embodiment shown, comparator circuit 23 is configured to perform a comparison of two differential voltages. The first of these differential voltages is that of the differential output signal, and more particularly, the difference in voltage between the Rect_P and Rect_N components of the differential output signal. The second of these differential voltages is the voltage difference between the Vref_P and Vref_N components of the differential reference voltage.

If the first differential voltage is greater than the second differential voltage (e.g., (Rect_P−Rect_N)>(Vref_P−Vref_N)), then comparator circuit 23 may assert the WakeUp signal in order to cause interface circuit 16 to exit a low power state. If the first differential voltage is less than the second differential voltage, then the WakeUp signal is not asserted.

During normal communications between interface circuit 16 and peripheral device 11, the transmitted signal levels may be such that detector 20 does not assert the WakeUp signal. Similarly, when interface circuit 16 is in a low power state, the signal levels on the differential signal path coupled to peripheral device 11 may be such that the WakeUp signal is not asserted. Thus, as noted above, in order to cause an exit from the low power state by interface circuit 16, peripheral device 11 may transmit an out-of-band signal having a differential voltage sufficient to cause detector 20 to assert the wakeup signal.

Figure 3:
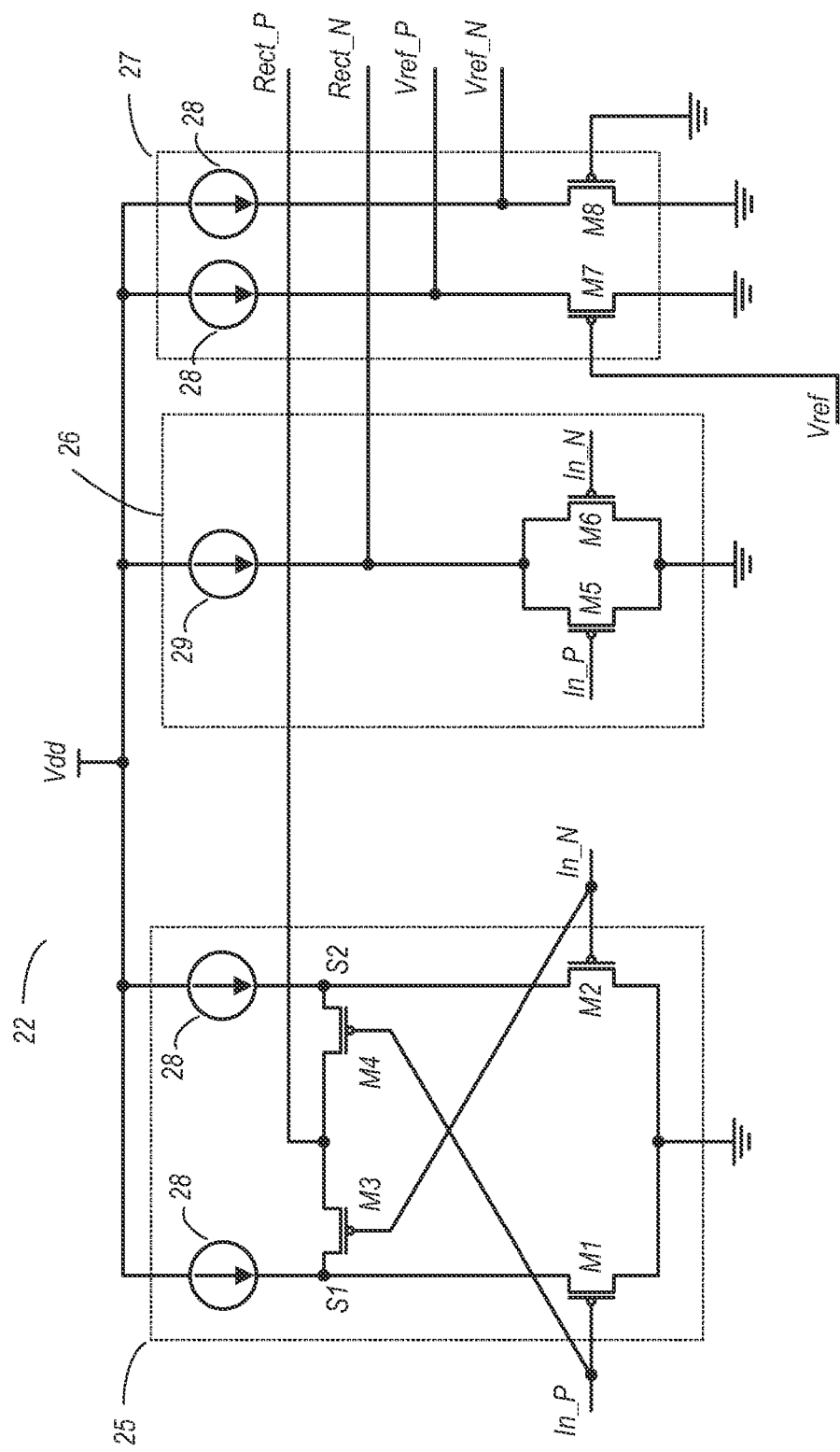
FIG. 3 is a schematic diagram of one embodiment of a circuit implemented in a detector.

Detector and Input Circuit, 1st Embodiment:

FIG. 3 illustrates one embodiment of an input circuit 22 of detector 20. In the embodiment shown, input circuit 22 includes three differential circuits that are used to generate the various output signals. A first differential circuit 25 in the embodiment shown is configured to level shift and positively rectify components of the differential input signal in order to produce the Rect_P component of the differential output signal. A second differential circuit 26 in the embodiment shown is configured to level shift and negatively rectify components of the differential input signal in order to produce the Rect_N component of the differential output signal. A third differential circuit 27 in the embodiment shown is configured to generate a differential reference voltage including the components Vref_P and Vref_N based on the received reference voltage, Vref, and a ground voltage.

First differential circuit 25 in the embodiment shown includes transistors M1, M2, M3, and M4. Respective gate terminals of transistors M1 and M3 are coupled to receive the In_P component of the differential input signal. Respective gate terminals of transistors M2 and M3 are coupled to receive the In_N component of the differential input signal. Respective source terminals of transistors M1 and M3 are coupled at node S1, while respective source terminals of transistors M2 and M4 are coupled at node S2. First differential circuit 25 also includes first and second current sources 28 coupled to nodes S1, and S2, respectively. The first and second current sources 28 may be substantially matched current sources that provide approximately the same amount of current to their respectively coupled nodes.

Transistors M1 and M2 in the embodiment shown perform positive level shifting function of their respectively received components of the differential input signal. Transistor M1 may positively level shift a voltage of the In_P component by an amount equal to its threshold voltage. Accordingly, the voltage on node S1 may be equal to at least a sum of the voltage on the gate terminal of transistor M1 plus its threshold voltage. Similarly, transistor M2 may positively level shift a voltage of the In_N component by an amount equal to its threshold voltage. Accordingly, the voltage on node S2 may be equal to at least the sum the voltage on the gate terminal of transistor M2 plus its threshold voltage. It is noted that transistors M1 and M2 may be substantially matched in size, threshold voltage, and other parameters in order that they exhibit substantially the same characteristics during operation.

Transistors M3 and M4 in the embodiment shown may provide a positive rectification function, at a level shifted voltage, to produce the Rect_P component of the differential output signal. During the operation of first differential circuit 25, one of transistors M3 or M4 may be active during certain portions of the signal cycle. When transistor M3 is active, the In_P component of the differential input signal is positively rectified to produce a portion of the Rect_P component of the differential output signal. Similarly, when transistor M4 is active, the In_N component of the differential input signal is positively rectified to produce another portion of the Rect_P component of the differential output signal. Transistors M3 and M4 may be substantially matched and may thus have operational characteristics that are approximately the same during operation.

Transistor M3 may become active during a portion of the input signal cycle in which the voltage of the In_P component is greater than the voltage of the In_N component. As the voltage of In_P rises, the voltage on node 51 also rises, since it is at least a threshold voltage (of M1) greater than the voltage of In_P. Furthermore, as the voltage of In_P rises, the voltage of In_N falls. When the voltage of In_N has fallen sufficiently in conjunction with a corresponding rise in the voltage of In_P, the source-gate voltage of transistor M3 is sufficient to cause its activation. When transistor M3 is activated, the Rect_P node is pulled to toward the voltage on node S1. Thus, as the voltage on node S1 rises, the voltage on Rect_P may also rise. As In_P begins to fall again, the voltage on Rect_P may correspondingly fall until the source-gate voltage across transistor M3 falls to the point that it becomes inactive.

Transistor M4 may become active during a portion of the input signal cycle in which the voltage of the In_N component is greater than the voltage of the In_P component. As the voltage of In_N rises, the voltage of node S2 also rises, remaining a threshold voltage (of transistor M2) above the gate voltage of In_N. Meanwhile, as the voltage of In_P falls, the gate-source voltage across transistor M4 (the voltage difference between S2 and In_P) becomes large enough to activate that device. When transistor M4 is activated, the voltage on Rect_P is pulled toward the voltage on S2. Accordingly, the voltage on Rect_P may be pulled higher as the rising voltage of In_N causes S2 to rise correspondingly. When In_N begins falling again, the voltage on Rect_P also falls correspondingly. Eventually, the voltage of In_N will fall while the voltage of In_P will rise to a point in which the source-gate voltage across transistor M4 is less than its threshold voltage. When the gate-source voltage is less than its respective threshold voltage, transistor M4 becomes inactive.

Second differential circuit 26 includes transistors M5 and M6, and further includes current source 29. In the embodiment shown, current source 29 may be configured to provide approximately twice the current of any of current sources 28 (each of which may provide an approximately equal amount of current). In an alternative embodiment, two instances of current source 28 may be placed in parallel between Vdd and Rect_N.

Second differential circuit 26 is configured to level shift and negatively rectify the differential input signal. Transistor M5 includes a gate terminal coupled to receive the In_P component of the differential input signal. The In_N component of the differential input signal may be received on the gate terminal of transistor M6. The source terminals of transistors M5 and M6 are coupled together at Rect_P. The drain terminals of transistors M5 and M6 are coupled together at ground.

In the embodiment of second differential circuit 26 shown in FIG. 3, transistors M5 and M6 are matched as close together as possible such that their respective threshold voltages are approximately equal. The voltage present on Rect_N at any point during operation in this embodiment is a positive voltage equal to the lesser one of the voltages of In_P and In_N plus a threshold voltage. Thus, as the voltage of In_P falls below the voltage of In_N, the voltage of Rect_N also falls, remaining at least a threshold voltage above the voltage of In_P. When the voltage of In_N falls to a level that is lower than the voltage of In_P, the voltage Rect_N follows that of In_N, remaining at least a threshold voltage above the latter.

Irrespective of which of In_P and In_N has the lesser voltage at any given time, the voltage of Rect_N is a positive voltage. Since the drain terminals of transistors M5 and M6 are both coupled to ground, a lower voltage limit is established on Rect_N. Accordingly, even when one of In_P or In_N is less than zero volts, the voltage on Rect_N may remain positive.

Third differential circuit 27 in the embodiment shown is configured to generate a differential reference voltage signal having two different components, Vref_P and Vref_N. Transistor M7 in the embodiment shown is coupled to receive a reference voltage on its gate terminal. The level of the reference voltage may be shifted by a threshold voltage of M7 in order to produce the Vref_P component of the differential reference voltage. Transistor M8 in the embodiment shown includes a gate terminal coupled to ground. Accordingly, the Vref_N component of the differential output signal may be held at a threshold voltage above ground.

Two current sources 28 are included in third differential circuit 27. A first of the current sources 28 is coupled to provide current to transistor M7, while a second current source 28 is coupled to provide current to transistor M8. Current sources 28 of third differential circuit 27 may be matched to each other as well as those of first differential circuit 25. Accordingly, each of the current sources 28 of input circuit 22 may provide substantially the same amount of current to their respectively coupled circuits.

It is noted that while the embodiment of input circuit 22 shown in FIG. 3 is implemented using p-channel metal oxide semiconductor (PMOS) transistors, embodiments using other types of transistors are possible and contemplated. Such types may include n-channel MOS (NMOS) transistors, graphene transistors, and so on.

Figure 4:
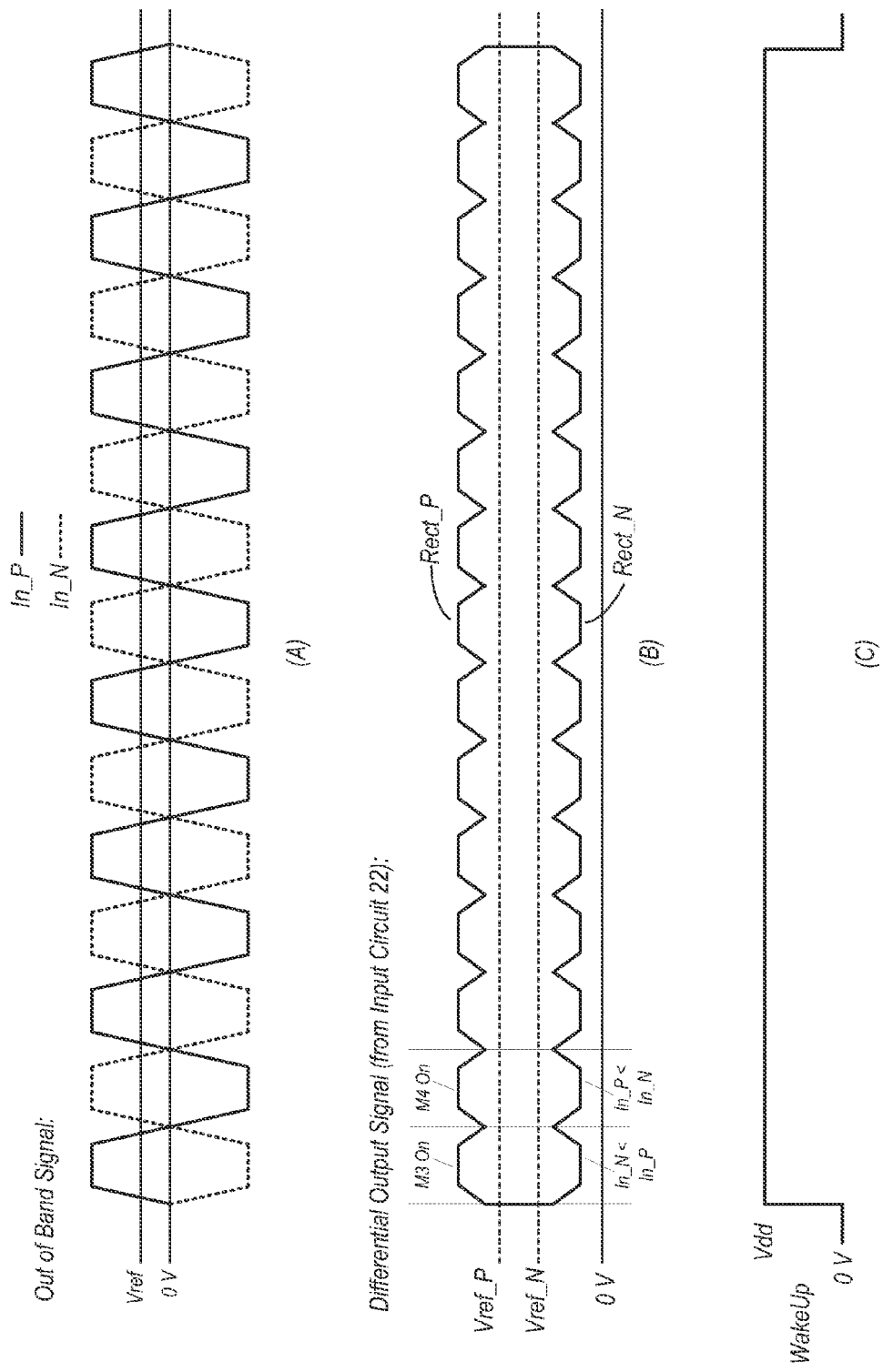
FIG. 4 is a timing diagram illustrating operation of one embodiment of the circuit shown in FIG. 3.

Timing Diagram and Method Flow for 1$^{st}$ Embodiment:

Turning now to FIG. 4, a timing diagram illustrating operation of one embodiment of the circuit shown in FIG. 3, and the corresponding operation of comparator circuit 23. In the illustrated example, an out-of-band differential signal is shown in (A). The out-of-band differential signal is transmitted on a differential signal path coupled to inputs of an input circuit 22. The out-of-band differential signal includes components In_P and In_N. When In_P is at its highest point, its voltage exceeds a threshold voltage. Similarly, when In_N is at its highest point, its voltage also exceeds the threshold voltage. Thus, the signal is considered to be out-of-band, as the voltage levels and magnitudes exceed a predetermined threshold voltage.

The differential output signal produced by input circuit 22 is shown in (B). The differential output signal includes two components, Rect_P and Rect_N. Rect_P is level shifted and positively rectified portion of the out-of-band differential input signal. Rect_N is a level shifted and negatively rectified portion of the out-of-band differential input signal. In the illustrated example, a first cycle of Rect_P is produced when transistor M3 is activated. As discussed above in reference to FIG. 3, transistor M3 is activated when the voltage of In_N falls to a sufficiently low level in conjunction with the rising voltage of In_P. When transistor M3 is active, the voltage on Rect_P is pulled toward the voltage of 51. The voltage of In_P initially rises before flattening out at its peak value. Correspondingly, the voltage of Rect_P also rises and flattens out. As the voltage of In_P begins falling again, the voltage of Rect_P also begins falling until the point when transistor M3 is deactivated.

During the portion of the cycle in which the voltage of In_P is rising, the voltage of In_N is falling. Accordingly, the voltage of Rect_N follows that of In_N. However, the voltage of Rect_N is level shifted in a positive direction relative to In_N, and is greater than 0 volts due to the circuit configuration of input circuit 22. Thus, Rect_N is produced at this point as a positively level shifted and negatively rectified version of In_N. As In_N reaches its trough, it flattens out before beginning to rise again. Rect_N follows In_N in this manner, flattening out at a trough before beginning to rise again.

As the voltage of In_P falls, the voltage of In_N correspondingly rises. Thus, as transistor M4 is activated as transistor M3 is deactivated. When transistor M4 is active, the voltage of Rect_P is pulled toward that of node S2. Rect_P again rises, flattens out, and then begins falling, in correspondence with In_N during this portion of the cycle. Thus, Rect_N at this point of the cycle is a positively level shifted and positively rectified version of In_N. Furthermore, when In_P is less than In_N, Rect_N is a positively level shifted and negatively rectified portion of In_P.

In the example shown, the voltage difference between Rect_P and Rect_N is greater than the difference between the voltages of Vref_P and Vref_N when the out-of-band signal is being transmitted. As noted in FIG. 2, comparator circuit 23 is configured to compare the voltage difference between Rect_P and Rect_N to the voltage difference between Vref_P and Vref_N. Since the voltage difference between Rect_P and Rect_N exceeds the voltage difference of Vref_P and Vref_N in this example, comparator circuit 23 may assert the WakeUp signal, as shown in (C).

Figure 5:
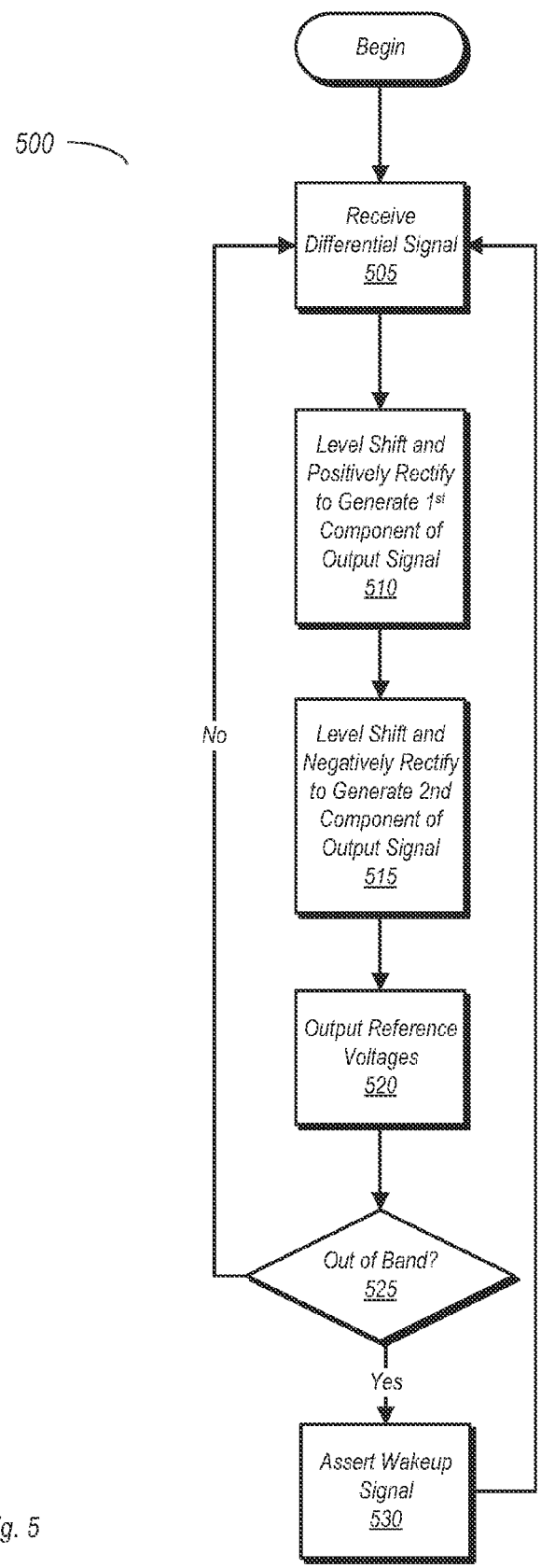
FIG. 5 is a flow diagram illustrating operation of one embodiment of a detector circuit including the input circuit of FIG. 3.

FIG. 5 is a flow diagram illustrating the operation of one embodiment of a detector including an input circuit such as that illustrated in FIG. 3. Method 500 begins with the receiving of a differential input signal (block 505). A differential output signal may be generated based on the received differential input signal. The input circuit may level shift and positively rectify the differential input signal in order to generate a first component of a corresponding differential output signal (block 510). A second component of the differential output signal may be generated by level shifting and negatively rectifying the differential input signal (block 515). In addition, the input circuit may output first and second reference voltages (block 520) to provide a basis for comparing voltage differences.

A comparator circuit may receive the first and second components of the differential output signal and the first and second reference voltages. A comparison operation may be performed to determine if the received differential input signal is an out-of-band signal. If the difference between the first and second components of the differential output signal is greater than the difference between the first and second reference voltages, then the differential input signal is determined to be out-of-band (block 525, yes). Responsive to determining that the differential input signal is an out-of-band signal, the comparator circuit may assert the WakeUp signal in order to cause a correspondingly coupled circuit to exit a sleep mode. If the differential input signal is determined to not be an out-of-band signal (block 525) no, then the WakeUp signal is not asserted. In either case, the method may then return to block 505.

Figure 6:
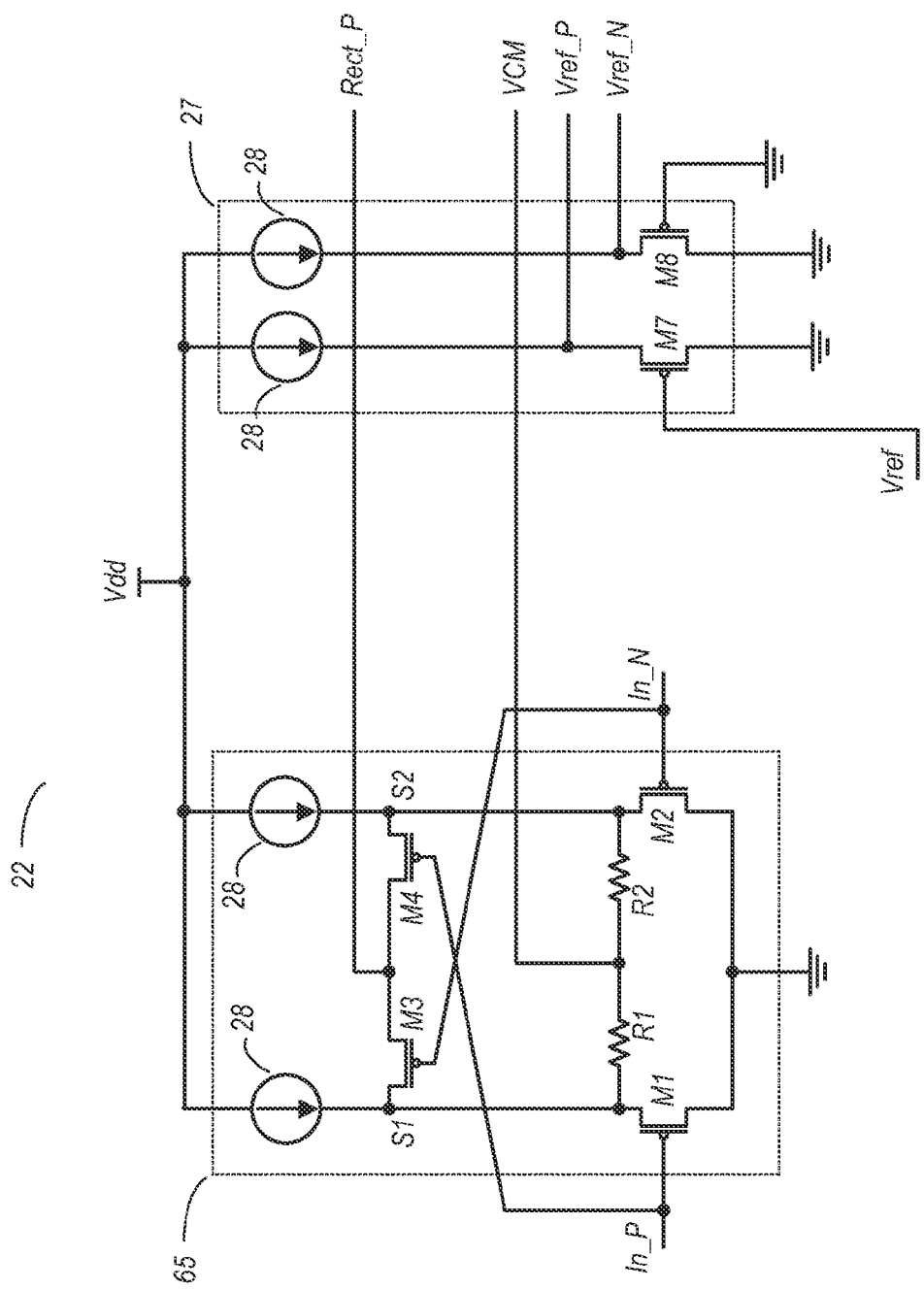
FIG. 6 is a schematic diagram of another embodiment of a circuit implemented in a detector.

Detector and Input Circuit, 2$^{nd}$ Embodiment:

FIG. 6 is a schematic diagram illustrating another embodiment of an input circuit 22 of detector 20. Input circuit 22 in the embodiment shown in FIG. 6 differs from that shown in FIG. 3 in various aspects. In this embodiment, input circuit 22 is configured to produce Rect_P as one component of the differential output signal, but produces a level-shifted common mode voltage, VCM, as the other component of the differential output signal (in lieu of Rect_N). Accordingly, input circuit 22 in this embodiment does not include differential circuit 26 as does the embodiment shown in FIG. 3. Instead, input circuit 22 of FIG. 6 is implemented using differential circuit 65 and differential circuit 27 to produce the output signals provided to comparator circuit 23. The embodiment shown in FIG. 6 uses fewer devices than the embodiment of FIG. 3, and may thus consume less power. The embodiment of FIG. 3 may perform well over a wider variety of process variations.

In the embodiment of input circuit shown in FIG. 6, differential circuit 65 is configured to generate the Rect_P and VCM components of a differential output signal. Generation of the Rect_P signal in the illustrated embodiment includes level shifting of the input signal components In_P and In_N, and positive rectification. Transistors M1 and M2 perform the level shifting functions. At any given time, the voltage level on node S1 (which is coupled to the source terminals of both M1 and M3) will be at least one threshold voltage of M1 above that of In_P. Similarly, the voltage level on node S2 (coupled to source terminals of M2 and M4) will be at least one threshold voltage of M2 above In_N at any given time.

When the voltage level of In_P is rising and is greater than that of In_N, the voltage on S1 is also rising, while the voltage of level of In_N is falling. Since In_N is received by the gate terminal of M3, the rising level of S1 combined with the falling level of In_N produces a sufficient source-gate voltage difference across M3 to activate this device. When M3 is active, Rect_P is pulled up toward S1.

As In_P begins to fall, In_N begins to rise. Correspondingly, the voltage on S2 begins to rise, while the voltage on S1 begins to fall. When the source gate voltage difference across M3 has fallen to less than the threshold voltage of that device, M3 is deactivated. At approximately the same time, the source-gate voltage across transistor M4 may begin exceeding the device threshold voltage due to the rising voltage on node S2 and the falling of In_P. Accordingly, M4 is activated, and thus Rect_P is pulled up toward the voltage on S2. The alternating activation of M3 and M4 may continue to repeat during the time the out-of-band signal is received.

The common mode voltage, VCM, is produced through the resistor network including resistors R1 and R2. Resistors R1 and R2 in the embodiment shown have substantially equal resistance values. In the illustrated configuration, VCM is equal to a voltage value that is one threshold voltage of M1 or M2 above ground. It is noted that transistors M1 and M2 have substantially equal threshold voltages. It is also noted that the out-of-band signal has a common mode voltage of zero volts, or ground. In the out-of-band signal, one of components In_P or In_N is above and the other component is below approximately zero volt at any given time. Accordingly, one of nodes S1 or S2 is at a threshold voltage above the input signal component In_P and the other node is at a threshold voltage above the input signal component In_N at a given time. Furthermore, at any given time, VCM is equal to one half the sum of the voltages on nodes S1 and S2, i.e. the average of the voltages on S1 and S2. In contrast to the voltage of Rect_P, VCM is not dominated by the greater of the two voltages on nodes S1 and S2. As noted above, the voltage of Rect_P is a threshold voltage above the greater of the respective threshold voltages of M1 or M2 (which are substantially equal) at any given time. Since VCM is equal to the average of the voltages on S1 and S2, it thus remains less than the voltage of Rect_P.

Similar to the embodiment of FIG. 3, the embodiment of input circuit 22 shown in FIG. 6 includes a differential circuit 27 configured to generate Vref_P and Vref_N. Transistor M7 level shifts the input reference voltage, Vref, by a threshold voltage to generate Vref_P. Similarly, transistor M8 level shifts a ground voltage by a threshold voltage to generate Vref_N.

Figure 7:
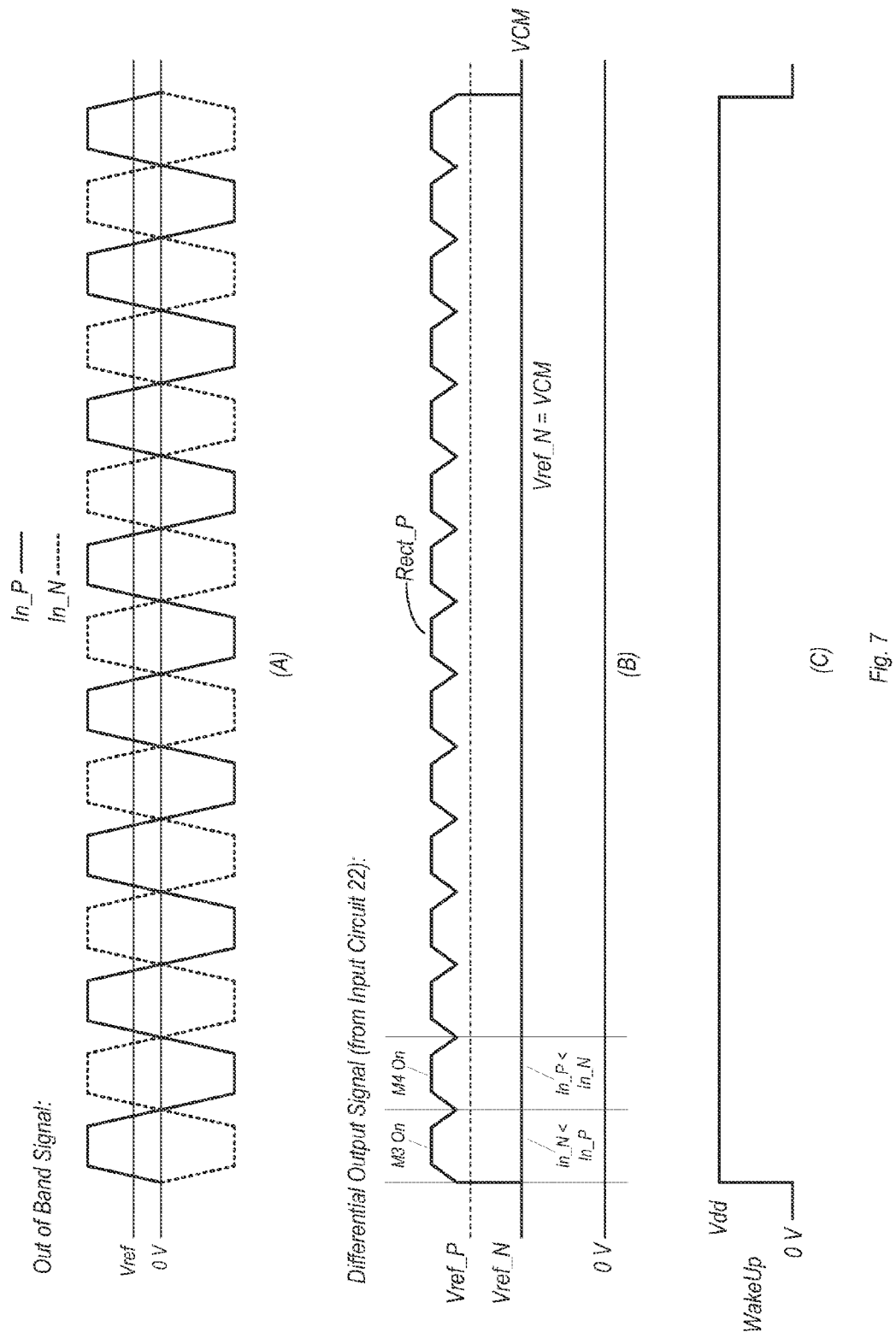
FIG. 7 is a timing diagram illustrating operation of one embodiment of the circuit shown in FIG. 6.

Timing Diagram and Method Flow for 2$^{nd}$ Embodiment:

FIG. 7 is a timing diagram illustrating operation of one embodiment of the circuit shown in FIG. 6. The out-of-band differential signal is shown in part (A) of FIG. 6. As previously noted, the out-of-band differential signal is transmitted on a differential signal path coupled to inputs of an input circuit 22, and includes components In_P and In_N. The voltage swing of the out-of-band signal exceeds a designated voltage level and thus is considered to be out of band.

In (B), the differential output signal produced by differential circuit 65 is shown. As previously noted, the output signal produced by differential circuit 65 includes two components, Rect_P and VCM. The VCM component is the common mode voltage of In_P and In_N, after level shifting by an amount equal to the threshold voltages over M1 and M2 (which are substantially equal). Furthermore, the voltage of VCM is substantially equal to the voltage of Vref_N. The Rect_P signal is generated as described above, by alternately activating M3 and M4. When M3 is active, Rect_P is pulled toward node S1. When M4 is active, Rect_P is pulled toward node S2.

Comparator circuit 23 is configured to compare the difference between Rect_P and VCM to the difference between Vref_P and Vref_N when the embodiment shown in FIG. 6 is used to implement input circuit 22. Since VCM and Vref_N are substantially equal, the comparison is effectively performed between the voltages of Rect_P and Vref_P. Thus, when Rect_P is greater than Vref_P in the illustrated example, the Wakeup signal is asserted, as shown in ©.

Figure 8:
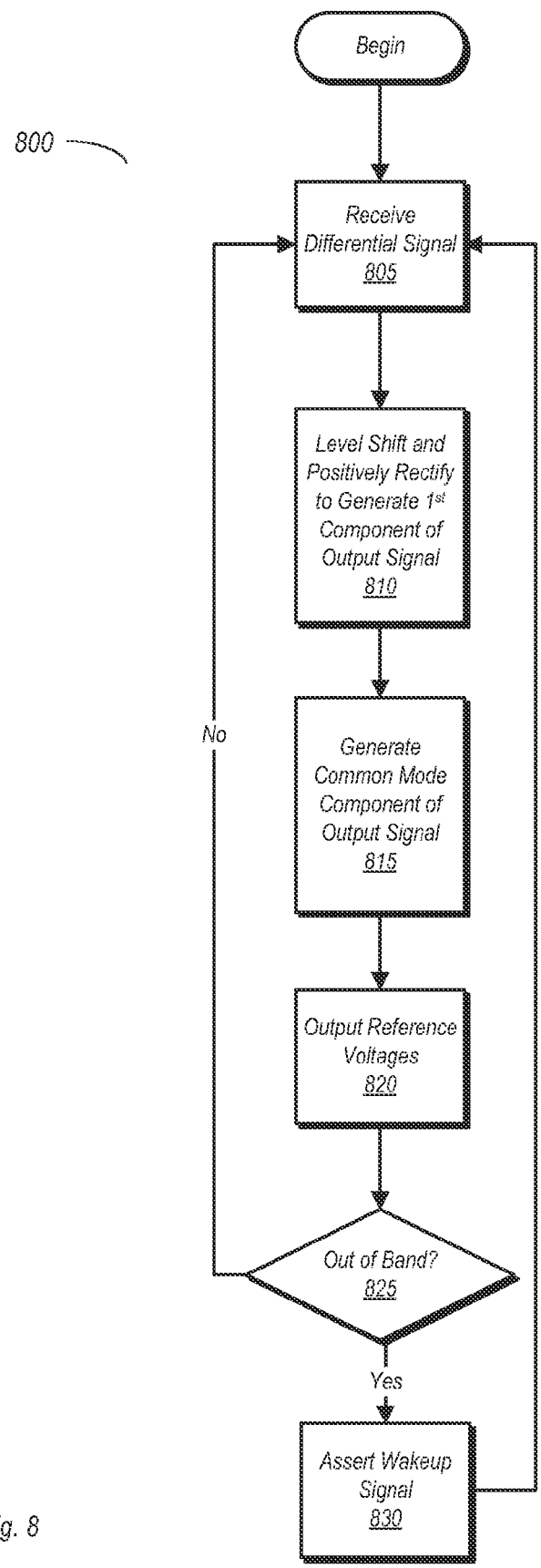
FIG. 8 is a flow diagram illustrating operation of one embodiment of a detector circuit including the input circuit of FIG. 6.

FIG. 8 is a flow diagram illustrating operation of one embodiment of a detector circuit including the input circuit of FIG. 6. Method 800 begins with the receiving of a differential input signal (block 805). A differential output signal may be generated based on the received differential input signal. The input circuit may level shift and positively rectify the differential input signal in order to generate a first component of a corresponding differential output signal (block 810). A second component of the differential output signal may be generated by level shifting a common mode voltage of the input signal to generate a corresponding common mode component of the differential output signal (block 815). The input circuit may output first and second reference voltages (block 820) to provide a basis for comparing voltage differences.

A comparator circuit may receive the first and second components of the differential output signal and the first and second reference voltages. A comparison operation may be performed to determine if the received differential input signal is an out-of-band signal. If the difference between the first and second components of the differential output signal is greater than the difference between the first and second reference voltages, then the differential input signal is determined to be out-of-band (block 825, yes). As discussed above, this determination may be made when Rect_P exceeds Vref_P, assuming VCM and Vref_N are substantially equal. Responsive to determining that the received differential input signal is an out-of-band signal, the Wakeup signal is asserted (block 830). If the differential input signal is determined to not be an out-of-band signal (block 825) no, then the Wakeup signal is not asserted. In either case, the method may then return to block 805.

Figure 9:
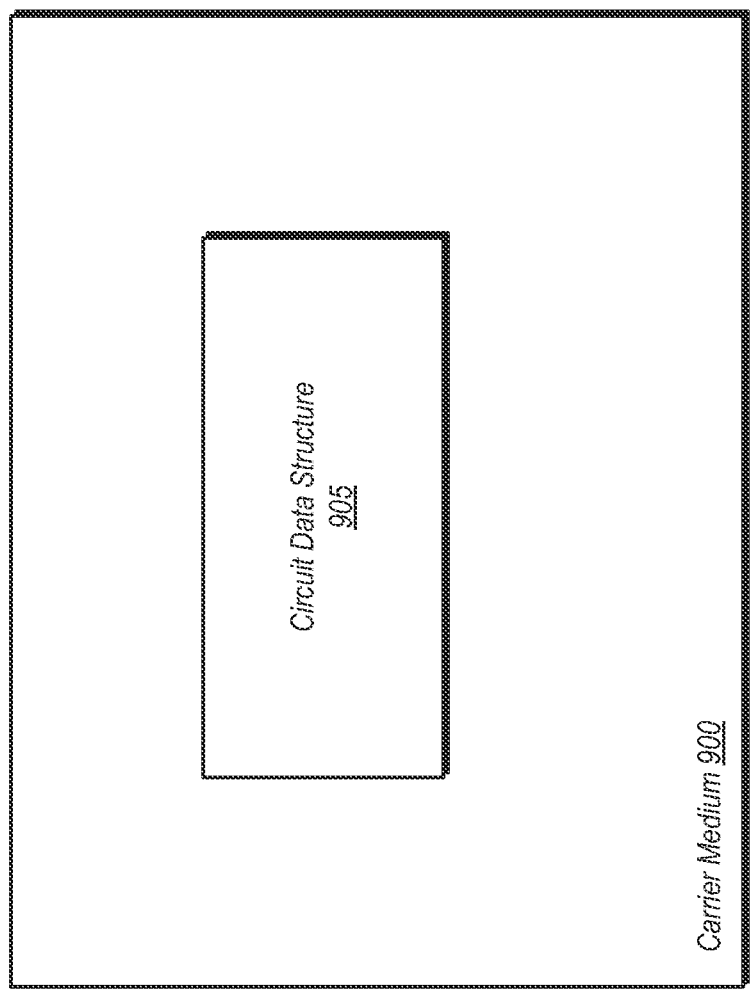
FIG. 9 is a block diagram of one embodiment of a carrier medium.

Carrier Medium:

Turning next to FIG. 9, a block diagram of a computer accessible storage medium 900 including a database 905 representative of one or more components of system 10 is shown. Generally speaking, a computer accessible storage medium 900 may include any non-transitory storage media accessible by a computer during use to provide instructions and/or data to the computer. For example, a computer accessible storage medium 900 may include storage media such as magnetic or optical media, e.g., disk (fixed or removable), tape, CD-ROM, or DVD-ROM, CD-R, CD-RW, DVD-R, DVD-RW, or Blu-Ray. Storage media may further include volatile or non-volatile memory media such as RAM (e.g. synchronous dynamic RAM (SDRAM), double data rate (DDR, DDR2, DDR3, etc.) SDRAM, low-power DDR (LP-DDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media may include microelectromechanical systems (MEMS), as well as storage media accessible via a communication medium such as a network and/or a wireless link.

Generally, the data 905 representative of the system 10 and/or portions thereof carried on the computer accessible storage medium 900 may be a database or other data structure which can be read by a program and used, directly or indirectly, to fabricate the hardware comprising the system 10. For example, the database 605 may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising the system 10. The netlist may then be placed and routed to produce a data set describing geometric shapes to be applied to masks. The masks may then be used in various semiconductor fabrication steps to produce a semiconductor circuit or circuits corresponding to the system 10. Alternatively, the database 905 on the computer accessible storage medium 900 may be the netlist (with or without the synthesis library) or the data set, as desired, or Graphic Data System (GDS) II data.

While the computer accessible storage medium 900 carries a representation of the system 10, other embodiments may carry a representation of any portion of the system 10, as desired, including bridge unit 14, detector 20 and portions thereof (e.g., input circuit 22). In general, computer accessible storage medium 900 may carry a representation of any part of system 10 or any component thereof, including portions of integrated circuits implemented therein.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A circuit comprising:
a first differential circuit configured to level shift and positively rectify a differential input signal to produce a first output component of a differential output signal, and further configured to generate and provide a common mode voltage of the differential input signal as a second component of the differential output signal;
a second differential circuit configured to level shift and output first and second to fixed voltages based on an input reference voltage and a ground voltage;
wherein the circuit is configured to provide the differential output signal and the first and second fixed voltages to an indicator circuit configured to assert an indication responsive to detecting that a differential voltage of the differential output signal is greater than a differential voltage of the first and second fixed voltages.

2. The circuit as recited in claim 1, wherein the first differential circuit includes a first level shifting transistor having a gate terminal coupled to receive a first input component of the differential input signal and a second level shifting transistor having a gate terminal coupled to receive a second input component of the differential input signal.

3. The circuit as recited in claim 2, wherein the first differential circuit further includes:
a first rectifying transistor coupled between a source terminal of the first level shifting transistor and a first output node configured to convey the first component of the differential output signal, wherein the first rectifying transistor includes a gate terminal coupled to receive the second component of the differential input signal; and
a second rectifying transistor coupled between a source terminal of the second level shifting transistor and the first output node, wherein the second rectifying transistor includes a gate terminal coupled to receive the first component of the differential input signal.

4. The circuit as recited in claim 3, further comprising a first current source coupled to provide current to the first level shifting transistor and the first rectifying transistor, and a second current source coupled to provide current to the second level shifting transistor and the second rectifying transistor.

5. The circuit as recited in claim 3, further comprising:
a first resistor coupled between the source terminal of the first level shifting transistor and a second output node configured to convey the second component of the differential output signal; and
a second resistor coupled between the source terminal of the second level shifting transistor and the second output node;
wherein the first and second resistors have an approximately equal resistance value, and wherein the common mode voltage is substantially equal to the second fixed voltage.

6. The circuit as recited in claim 3, further comprising:
a third level shifting transistor, the third level shifting transistor having a gate terminal coupled to receive the input reference voltage and a source terminal coupled to a third output node configured to convey the first fixed voltage; and
a fourth level shifting transistor, the fourth level shifting transistor having a gate terminal coupled to receive the ground voltage and a source terminal coupled to a fourth output node configured to convey the second fixed voltage.

7. A method comprising:
generating a first output component of a differential output signal by a first differential circuit level shifting and positively rectifying a differential input signal;
generating a second output component of the differential output signal by the first differential circuit generating a common mode voltage of the differential input signal;
generating first and second fixed voltages in a second differential circuit based on an input reference voltage and a ground voltage;
asserting a signal responsive to a comparator determining that a voltage difference between the first and second components of the differential output signal is greater than a difference between the first and second fixed voltages.

8. The method as recited in claim 7, further comprising:
receiving a first input component of the differential input signal;

receiving a second input component of the differential signal;
level shifting the first input component in the first differential circuit; and
level shifting the second input component in the first differential circuit.

9. The method as recited in claim 8, further comprising:
positively rectifying, in the first differential circuit, the first input component if its voltage is greater than a voltage of the second input component;
positively rectifying, in the first differential circuit, the second input component if its voltage is greater than the voltage of the first input component; and
generating the common mode voltage on an output node coupled to a first resistor and a second resistors, wherein the first resistor is coupled between a source terminal of a first level shifting transistor of the first differential circuit and the output node, and wherein the second resistor is coupled between a source terminal of a second level shifting transistor of the first differential circuit and the output node.

10. The method as recited in claim 7, further comprising:
level shifting the input reference voltage by a transistor threshold voltage to generate the first fixed voltage; and
level shifting a ground voltage by the transistor threshold voltage to generate the second fixed voltage.

11. An integrated circuit comprising:
a detector coupled to receive a differential input signal from an external device, and wherein the detector includes:
a first differential circuit configured to level shift and positively rectify a differential input signal to produce a first output component of a differential output signal, and further configured to generate and provide a common mode voltage of the differential input signal as a second component of the differential output signal; and
a second differential circuit configured to level shift and output first and second fixed voltages based on an input reference voltage and a ground voltage;
wherein the detector is configured to provide an indication when the differential output signal has a differential voltage greater than a difference between the first and second fixed voltages responsive to a request from the external device.

12. The integrated circuit as recited in claim 11, wherein the integrated circuit includes an interface circuit configured to enter a low power state after a predetermined idle time, and wherein the interface circuit is configured to exit the low powered state responsive to the detector providing the indication.

13. The integrated circuit as recited in claim 12, wherein the interface circuit is configured to communicate with the external device over a differential signal path, and wherein the detector is configured to receive the differential input signal from the differential signal path.

14. The integrated circuit as recited in claim 13, wherein an indicator circuit is configured to assert the indication responsive to receiving an out-of-band signal from the external device.

15. The integrated circuit as recited in claim 14, wherein the out-of-band signal has a differential voltage that is greater than a differential voltage used for other communications between the external device and the interface circuit.

16. The integrated circuit as recited in claim 11, wherein the first differential circuit includes a first level shifting transistor having a gate terminal coupled to receive a first input component of the differential input signal and a second level shifting transistor having a gate terminal coupled to receive a second input component of the differential input signal.

17. The integrated circuit as recited in claim 16, wherein the first differential circuit further includes:
a first rectifying transistor coupled between a source terminal of the first level shifting transistor and a first output node configured to convey the first component of the output signal, wherein the first rectifying transistor includes a gate terminal coupled to receive the second component of the differential input signal; and
a second rectifying transistor coupled between a source terminal of the second level shifting transistor and the first output node, wherein the second rectifying transistor includes a gate terminal coupled to receive the first component of the differential input signal.

18. The integrated circuit as recited in claim 17, further comprising a first current source coupled to provide current to the first level shifting transistor and the first rectifying transistor, and a second current source coupled to provide current to the second level shifting transistor and the second rectifying transistor.

19. The integrated circuit as recited in claim 18, wherein the first differential circuit further includes:
a first resistor coupled between the source terminal of the first level shifting transistor and a second output node;
a second resistor coupled between the source terminal of the second level shifting transistor and the second output node;
wherein the differential input signal is configured to generate the common mode voltage on the second output node.

20. The integrated circuit as recited in claim 16, wherein the second differential circuit includes:
a third level shifting transistor, the third level shifting transistor having a gate terminal coupled to receive the input reference voltage and a source terminal coupled to a third output node configured to convey the first fixed voltage; and
a fourth level shifting transistor, the fourth level shifting transistor having a gate terminal coupled to receive the ground voltage and a source terminal coupled to a fourth output node configured to convey the second fixed voltage.

* * * * *